United States Patent
Moriya

(10) Patent No.: US 8,710,567 B2
(45) Date of Patent: Apr. 29, 2014

(54) SEMICONDUCTOR DEVICE AND MANUFACTURING METHOD THEREOF

(75) Inventor: Tomohiko Moriya, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 87 days.

(21) Appl. No.: 13/033,620

(22) Filed: Feb. 24, 2011

(65) Prior Publication Data

US 2011/0204450 A1 Aug. 25, 2011

(30) Foreign Application Priority Data

Feb. 25, 2010 (JP) ................................ 2010-039768

(51) Int. Cl.
*H01L 23/48* (2006.01)

(52) U.S. Cl.
USPC .... 257/300; 257/306; 257/309; 257/E21.068; 438/244; 438/627; 438/240

(58) Field of Classification Search
USPC ................. 257/300, 296, 306, 309, E29, 226, 257/E21.068; 438/244, 627, 240
See application file for complete search history.

(56) References Cited

U.S. PATENT DOCUMENTS

| | | | | |
|---|---|---|---|---|
| 6,870,220 B2 * | 3/2005 | Kocon et al. | ................... | 257/340 |
| 7,078,758 B2 * | 7/2006 | Shinkawata | ................... | 257/300 |
| 7,598,545 B2 | 10/2009 | Cartier et al. | | |
| 7,718,496 B2 * | 5/2010 | Frank et al. | ................... | 438/275 |
| 7,989,898 B2 | 8/2011 | Chang et al. | | |
| 8,207,584 B2 | 6/2012 | Nabatame et al. | | |
| 8,212,322 B2 | 7/2012 | Frank et al. | | |
| 2006/0237796 A1 | 10/2006 | Cartier et al. | | |
| 2006/0244035 A1 * | 11/2006 | Bojarczuk et al. | ............ | 257/314 |
| 2007/0105317 A1 | 5/2007 | Nakajima | | |
| 2009/0108373 A1 * | 4/2009 | Frank et al. | ................... | 257/392 |
| 2010/0109044 A1 * | 5/2010 | Tekleab et al. | ................ | 257/190 |
| 2012/0181610 A1 * | 7/2012 | Frank et al. | ................... | 257/351 |

FOREIGN PATENT DOCUMENTS

| | | |
|---|---|---|
| JP | 2002-110816 | 4/2002 |
| JP | 2007-134456 | 5/2007 |
| JP | 2008-537359 | 9/2008 |
| JP | 2009-141161 | 6/2009 |
| JP | 2009-290200 | 12/2009 |
| WO | 2009056417 | 5/2009 |

OTHER PUBLICATIONS

S. Kubicek et al.—Strain enhanced Low-VT CMOS featuring LA/Al-doped HfSiO/TaC and 10ps Invertor Delay; 2008 Symposium on VLSI Technology Digest of Technical Papers—pp. 130-131.
JP Office Action dated Oct. 15, 2013, with English translation; Application No. 2010-039768.

* cited by examiner

*Primary Examiner* — Michael Shingleton
(74) *Attorney, Agent, or Firm* — Young & Thompson

(57) ABSTRACT

The semiconductor device of the present invention includes a silicon substrate having a logic region and a RAM region, an NMOS transistor formed in the logic region, and an NMOS transistor formed in the RAM region. The NMOS transistor has a stack structure obtained by sequentially stacking the gate insulating film and the metal gate electrode over the silicon substrate. The NMOS transistor has a cap film containing an element selected from a group consisting of lanthanum, ytterbium, magnesium, strontium, and erbium as a composition element between the silicon substrate and metal gate electrode. The cap film is not formed in the NMOS transistor.

13 Claims, 19 Drawing Sheets

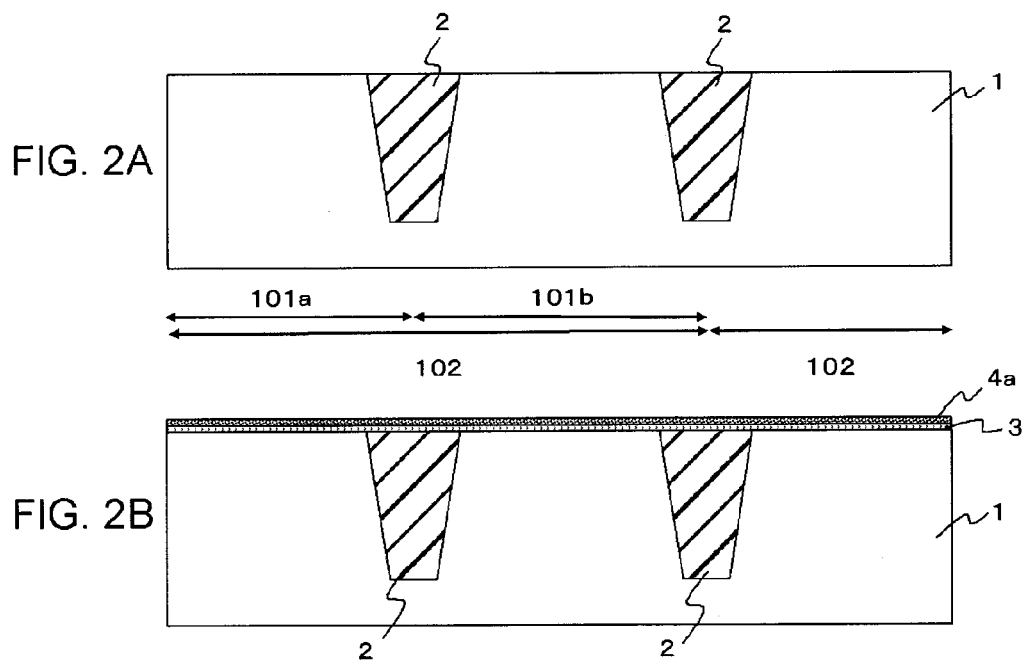

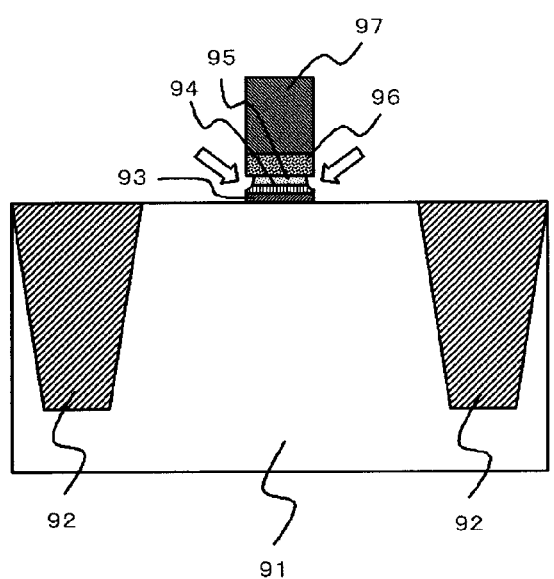
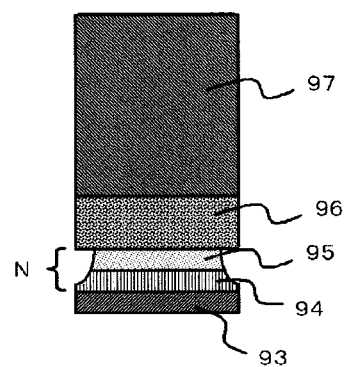
FIG. 17A
PRIOR ART
FIG. 17B
PRIOR ART

SEMICONDUCTOR DEVICE AND MANUFACTURING METHOD THEREOF

This application is based on Japanese patent application No. 2010-039768, the content of which is incorporated hereinto by reference.

BACKGROUND

1. Technical Field

The present invention relates to a semiconductor device and a manufacturing method thereof.

2. Related Art

Recently, in advanced device development for miniaturization after 32 nm node generation, it is anticipated that a high-dielectric constant (high-k) gate insulating film/metal gate (HK/MG) process technique will be put into practical use. In addition, there is known a technique, in which a memory such as a dynamic random access memory (DRAM), a static random access memory (SRAM) and a logic circuit such as a complementary metal oxide semiconductor (CMOS) are integrated on the same substrate. When the memory and the logic circuit are integrated using the HK/MG process, it is problematic that allowable limits of the leakage currents in each region are different.

Japanese Laid-open Patent Publication No. 2002-110816 discloses a technique in which the metal gate structure is adapted to a cell transistor, and a gate structure obtained by stacking poly-silicon and metal is adapted to the peripheral circuit. As a result, this document describes that the N-type transistor of the peripheral circuit controls the threshold voltage based on the N-type dopant density doped in the polysilicon, the dielectric constant and the thickness of the gate insulating film, and the P-type dopant density in the silicon crystal region, and the cell transistor controls the threshold voltage based on a work function of metal, the dielectric constant and the thickness of the gate insulating film, and the p-type dopant in the silicon crystal region. In addition, it is anticipated that the read or write speed of the DRAM memory can be improved.

In addition to the embedded memory technique, there is known a technique of a CMOS circuit, in which a metal (oxide) layer (metal cap film) is inserted between the metal gate electrode and the gate insulating film to adjust the threshold voltages of NMOSFET and CMOSFET (refer to Japanese Laid-open Patent Publication Nos. 2007-134456 and 2008-537359, and S. Kubiceketal, 2008, Symposium on VLSI Technology Digest of Technical Papers, pp. 130-131.

SUMMARY

However, the inventor found the following problem. According to Japanese Laid-open Patent Publication No. 2002-110816, a GIDL leakage current or threshold voltage variability tends to increase due to controlling the threshold voltage by the P-type dopant in the substrate. For this reason, in the DRAM region, since the leakage current increases, the hold characteristic may be degraded. In addition, since a random variability of the transistor characteristics is increased, and an abnormal leakage current becomes easy to occur, particularly, the product yield of the embedded SRAM device may be degraded. Therefore, the inventor desired to provide a technique capable of reducing threshold voltage variability or a leakage current in the RAM region of the embedded memory device obtained by integrating a memory such as DRAM or SRAM and Logic on one chip.

In one embodiment, there is provided a semiconductor device including: a substrate having a logic region and a random access memory (RAM) region; a first transistor formed in the logic region; and a second transistor formed in the RAM region, wherein the first and second transistors have a stack structure obtained by sequentially stacking a gate insulating film and a metal gate electrode on the substrate, the first transistor has a cap film containing an element selected from a group consisting of lanthanum, ytterbium, magnesium, strontium and erbium as a composition element between the substrate and the metal gate electrode, and the cap film is not formed in the second transistor.

In another embodiment, there is provided a method of manufacturing a semiconductor device, the method including: forming a gate insulating film over a substrate having a logic region and a random access memory (RAM) region; forming a metal gate electrode over the gate insulating film; forming a cap film interposed between the substrate and the metal gate electrode; and removing the cap film formed in the RAM region, wherein the cap film contains an element selected from a group consisting of lanthanum, ytterbium, magnesium, strontium, and erbium as a composition element.

According to the present invention, while the cap film is provided in the gate insulating film of the logic region, the RAM region does not have the cap film. As a result, it is possible to control the threshold voltage without implanting excessive ions to the RAM region. In addition, the RAM region may be formed as a structure that does not have difficulty in the process. Therefore, it is possible to reduce variability in the threshold voltage of the RAM region, and obtain an embedded memory device with an excellent product yield.

According to the present invention, it is possible to reduce variability in the threshold voltage of the RAM region and obtain an embedded memory device with an excellent product yield.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are diagrams illustrating a method of manufacturing a semiconductor device according to an embodiment of the invention;

FIGS. 17A and 17B are diagrams illustrating a semiconductor device of the related art;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary implementations according to the present invention will be described in detail as follows in reference to the annexed figures. In all figures, an identical numeral is assigned to an element commonly appeared in the figures, and the detailed description thereof will not be repeated.

Figure 1:
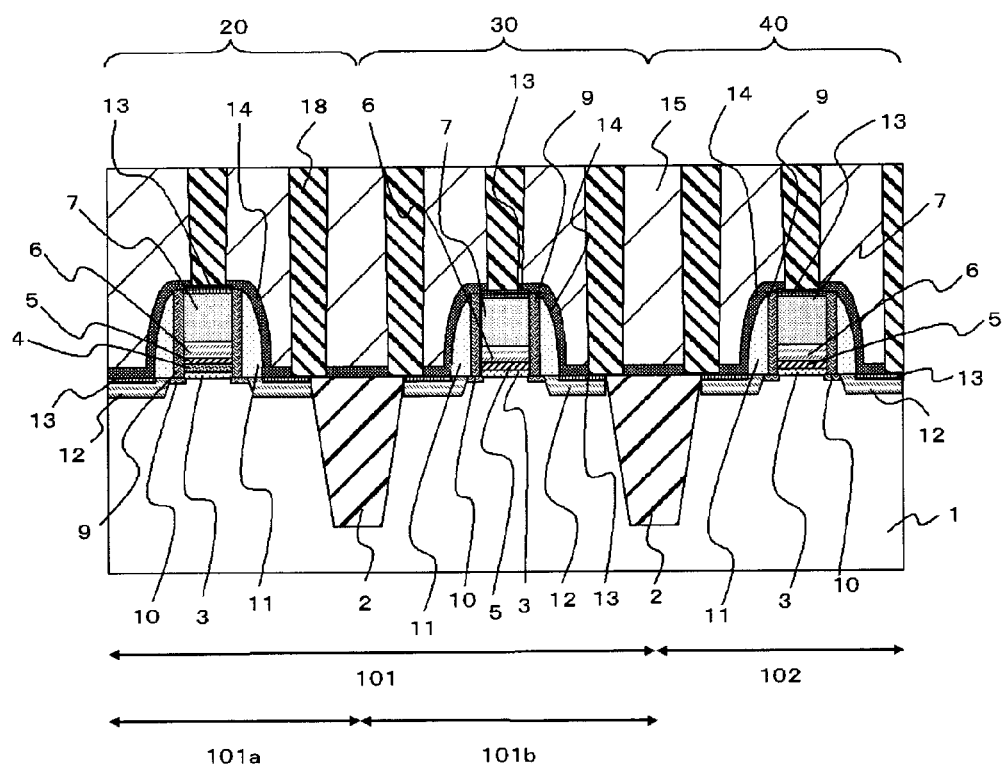
FIG. 1 is a cross-sectional view schematically illustrating a semiconductor device according to an embodiment of the invention.

FIG. 1 is a cross-sectional view schematically illustrating a semiconductor device according to the present embodiment. The semiconductor device according to the present embodiment includes a silicon substrate 1 having a logic region 101 and a DRAM region 102, an NMOS transistor 20 (first transistor) formed in the logic region 101, and an NMOS transistor 40 (second transistor) formed in the DRAM region 102. The NMOS transistor 20, 40 has a stack structure in which a gate insulating film 5 and a metal gate electrode 6 are sequentially stacked on the silicon substrate 1. The NMOS transistor 20 has a cap film 4 containing an element selected from a group consisting of lanthanum, ytterbium, magnesium, strontium, and erbium between the silicon substrate 1 and the metal gate electrode 6. The NMOS transistor 40 does not have the cap film 4.

Specifically, in the NMOS transistor 20, the cap film 4 is interposed between the gate insulating film 5 and the silicon substrate 1, and the cap film 4 and the gate insulating film 5 are formed to have contact with each other. In addition, in the logic region 101, the PMOS transistor 30 (third transistor) is formed. The PMOS transistor 30 also has a stack structure of the gate insulating film 5 and the metal gate electrode 6. Furthermore, the NMOS transistor 20 and the PMOS transistor 30 constitute a CMOS circuit. Therefore, the semiconductor device according to the present embodiment is constructed as an embedded DRAM device in which the DRAM cell of the DRAM region 102 and the CMOS circuit of the logic region 101 are integrated. Here, the NMOS transistor 40 is a transistor within the DRAM cell. Similarly, the PMOS transistor 30 does not have the cap film 4.

Here, the logic region 101 includes a peripheral circuit of the memory device within the DRAM region 102 and is formed in a region different from the DRAM region 102. For example, the logic region may include a high-speed logic circuit such as a Central Processing Unit (CPU).

The cap film 4 is thin metal film capable of controlling the threshold voltage of the MOSFET of a HK/MG structure. The thin metal film is formed to have contact with the gate insulating film 5, and, during the manufacturing process, doped and thermally diffused to the gate insulating film 5 to form a dipole between the silicon oxide film 3 and the gate insulating film 5. As a result, a band offset is shifted, and an effective work function is obtained in the metal gate electrode 6. For this reason, in the NMOS transistor 20 with the cap film 4 being inserted, the threshold voltage is decreased, and a high-speed operation of the CMOS logic can be made. Examples of the cap film 4 include $LaO_x$ such as $La_2O_3$, $Y_2O_3$, $SrO_x$, MgO, Sc, Er, and alloys of Sc and Er.

The gate insulating film 5 may include a high-dielectric constant insulation film and preferably includes hafnium as an essential element. The high-dielectric constant insulation film refers to an insulation film having a relative dielectric constant higher than that of the silicon oxide film (E=3.9), and preferably, a relative dielectric constant of 10 to 30. Specifically, the high-dielectric constant insulation film includes oxide containing hafnium. Examples of the oxide containing hafnium include HfSiON, $HfSiO_2$, $HfO_2$, and $HfZrO_2$. Preferably, $HfSiO_x$ or $HfO_2$ is used.

While a process of manufacturing the gate electrode typically includes a heating process, the cap film 4 underlying or overlying the gate insulating film 5 is affected by a thermal history of the heating process included in the process of manufacturing the gate electrode and is thermally diffused to the gate insulating film 5. Therefore, in the gate insulating film 5 of the NMOS transistor 20, elements of the cap film 4 are thermally diffused to the gate insulating film 5, and as a result, the threshold voltage of the NMOS transistor 20 is decreased. In addition to the process of manufacturing the gate electrode, heat may be intentionally applied to thermally diffuse elements of the cap film 4 to the gate insulating film 5. In this case, the elements of the cap film 4 may be thermally diffused to the gate insulating film 5, for example, by performing heating under a temperature of 900° C. to 1000° C. for $1\times10^{-2}$ to 10 seconds. In the gate insulating film 5, elements of the cap film 4 may be uniformly diffused to the gate insulating film 5 or may have a concentration gradient.

The metal gate electrode 6 may have a composition containing elements selected from a group consisting of titanium, tantalum and molybdenum. Specifically, a single material of such metal, nitride of such metal, or nitride of the compound between such metal and silicon may be used. For example, TiN, TaSiN, or Mo may be used in the metal gate electrode 6.

In addition, on the metal gate electrode 6, poly-silicon may be formed. As shown in FIG. 1, in the NMOS transistor 20, the gate electrode may be formed by sequentially stacking the silicon oxide film 3, the cap film 4, the gate insulating film 5, the metal gate electrode 6, and the poly-silicon 7 on the silicon substrate 1 having the p-type well. In addition, in the PMOS transistor 30, the gate electrode may be formed by sequentially stacking the silicon oxide film 3, the gate insulating film 5, and the metal gate electrode 6 on the silicon substrate 1 having the n-type well. In addition, in the NMOS transistor 40, the gate electrode may be formed by sequentially stacking the silicon oxide film 3, the gate insulating film 5, the metal gate electrode 6, and the poly-silicon 7 on the silicon substrate 1 having the p-type well.

Subsequently, a method of manufacturing the semiconductor device according to the present embodiment will be described. FIGS. 2A, 2B, 3A, 3B, 4A, 4B, and 5 to 12 are diagrams illustrating a method of manufacturing the semiconductor device according to the present embodiment. First, an element isolation layer 2 having a shallow trench isolation (STI) structure is formed on the semiconductor silicon substrate 1. As a result, it is possible to obtain a silicon substrate 1 having a logic region 101 and a DRAM region 102 (FIG. 2A). In addition, a NMOS region 101a and a PMOS region 101b are provided in the logic region 101.

Then, a p-type dopant is doped on the NMOS region 101a and the DRAM region 102 of the silicon substrate 1, and an n-type dopant is doped on the PMOS region 101b so that a p-type well (not shown) and an n-type well (not shown) are formed, respectively.

Then, a silicon oxide film 3 is deposited using a thermal oxidation method, and a cap film 4a is stacked on the silicon oxide film 3 using a sputtering method (FIG. 2B). When the lanthanum is used in the cap film 4a, the cap film 4a has a thickness of 0.2 nm to 2 nm. The lanthanum changes to oxide (LaO$_x$) after the deposition.

Figure 3A:
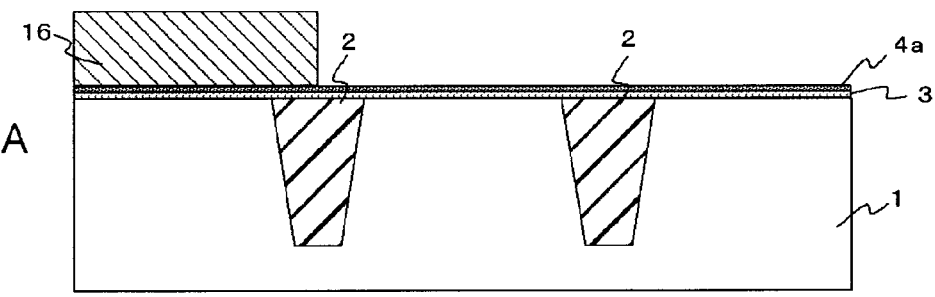
FIGS. 3A and 3B are diagrams illustrating a method of manufacturing a semiconductor device according to an embodiment of the invention.
Figure 3B:
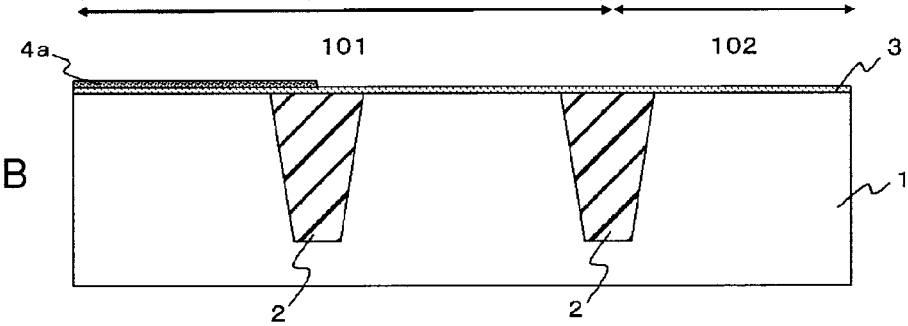

Then, a photo resist 16 is formed on the metal film 4a, and the photo resist 16 having the DRAM region 102 and the PMOS region 101b is removed through patterning. As a result, the DRAM region 102 and the PMOS region 101b are opened to expose the cap film 4a (FIG. 3A). Then, through wet etching, the exposed cap film 4a is removed. Then, the photo resist 16 remaining in the NMOS region 101a is removed through asking (FIG. 3B).

Figure 4A:
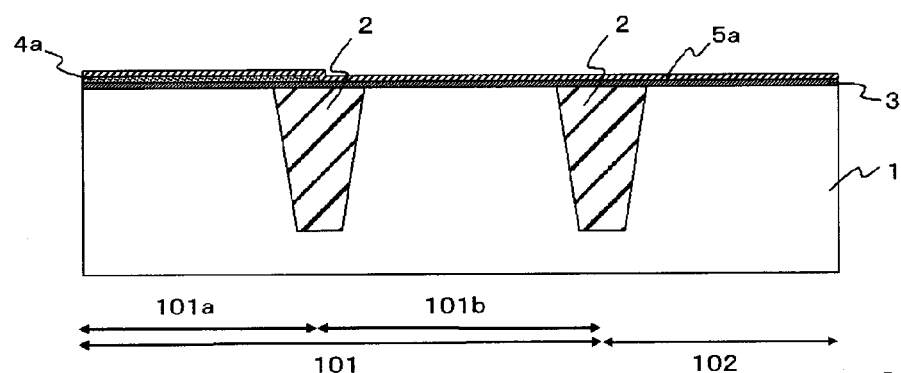
FIGS. 4A and 4B are diagrams illustrating a method of manufacturing a semiconductor device according to an embodiment of the invention.
Figure 4B:
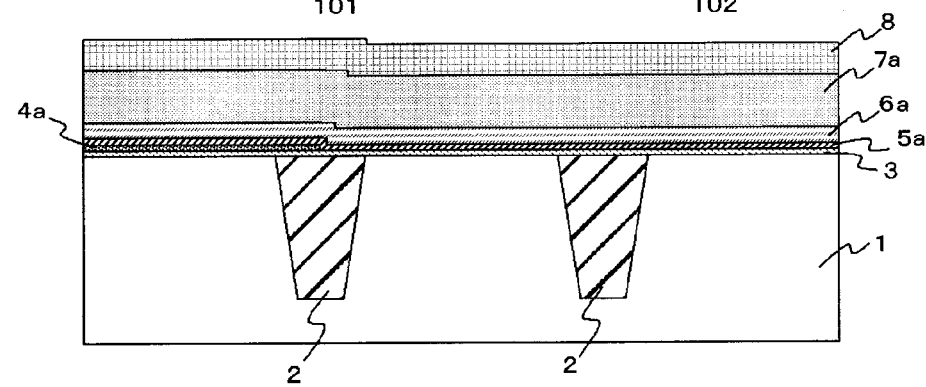

Then, a high-dielectric constant insulation film 5a is formed across the logic region 101 and the DRAM region 102 using a Chemical Vapor Deposition (CVD) method (FIG. 4A). When HfSiO$_x$ or HfO$_2$ is used in the high-dielectric constant insulation film 5a, the film thickness is set to 1 nm to 4 nm. Here, in the NMOS region 101a, the metal included in the cap film 4a is thermally diffused to the high-dielectric constant insulation film 5a. Then, the metal conductive layer 6a and the poly-silicon layer 7a included in the metal gate electrode are sequentially stacked on the high-dielectric constant insulation film 5a, and then, the surface of the resulting stack structure is covered by a hard mask 8 (FIG. 4B). When the metal conductive layer 6a is made of TiN, the film thickness is set to 5 nm to 50 nm. In addition, the poly-silicon 7 has a thickness of 30 nm to 100 nm.

Figure 5:
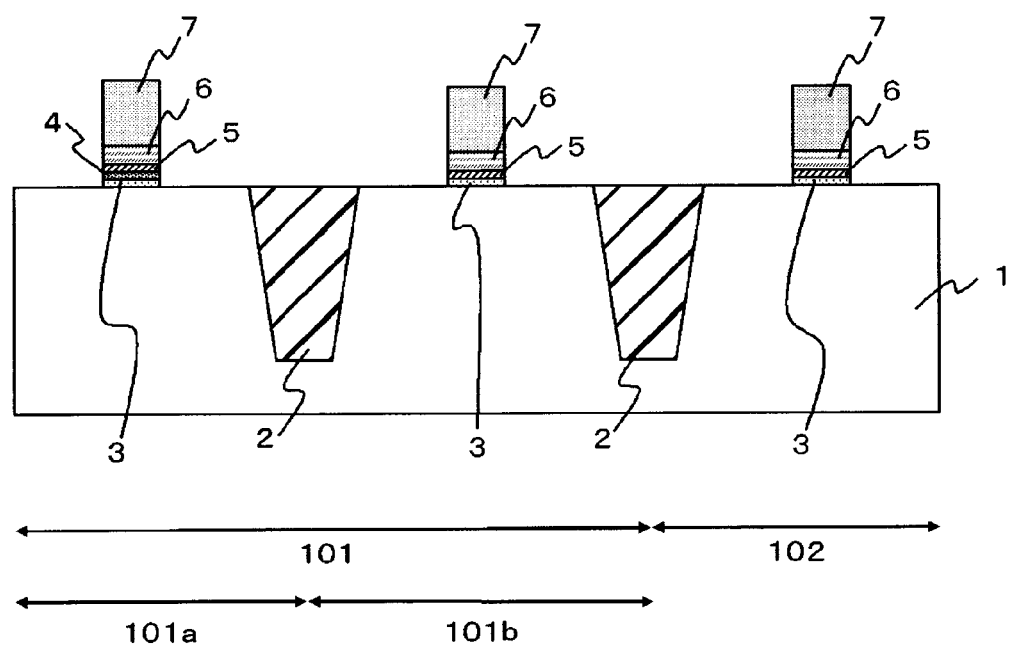
FIG. 5 is a diagram illustrating a method of manufacturing a semiconductor device according to an embodiment of the invention.
Figure 6:
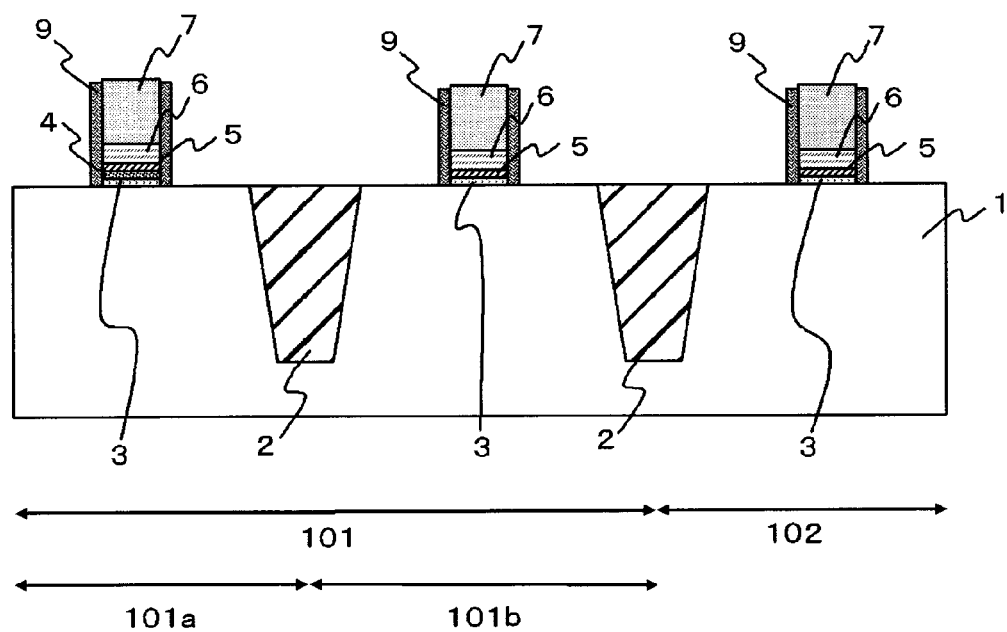
FIG. 6 is a diagram illustrating a method of manufacturing a semiconductor device according to an embodiment of the invention.
Figure 7:
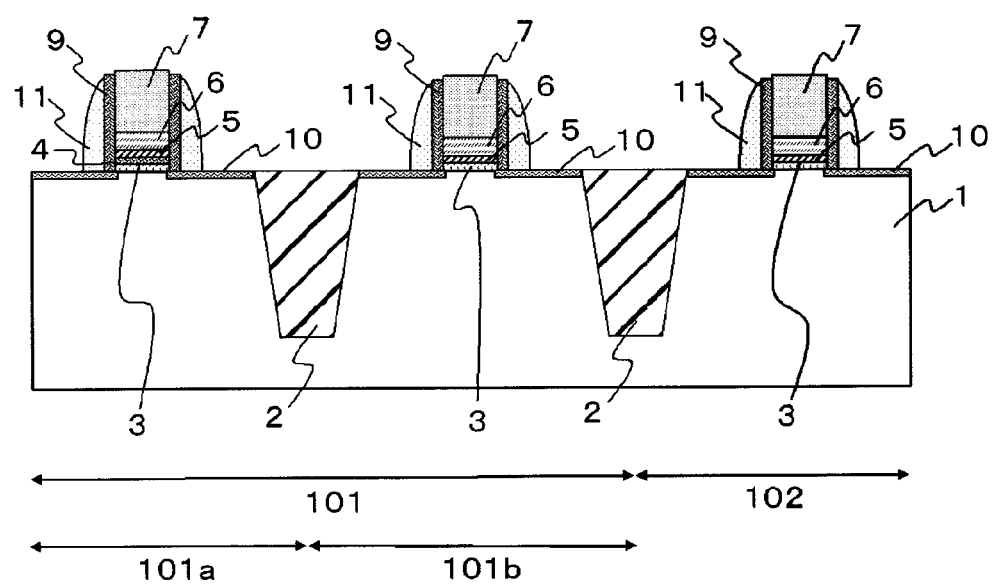
FIG. 7 is a diagram illustrating a method of manufacturing a semiconductor device according to an embodiment of the invention.

Then, using a lithographic technique of the related art, a layer structure including the high-dielectric constant insulation film 5a, the metal conductive layer 6a, and the poly-silicon layer 7a are patterned through dry etching so that only a predetermined region remains. Then, the photo resist is exfoliated and the deposition is removed through fluorine system wet etching so that the gate electrode including the poly-silicon layer 7a and the metal conductive layer 6a are formed in the NMOS region 101a and the PMOS region 101b of the logic region 101 and the DRAM region 102 (FIG. 5).

Figure 8:
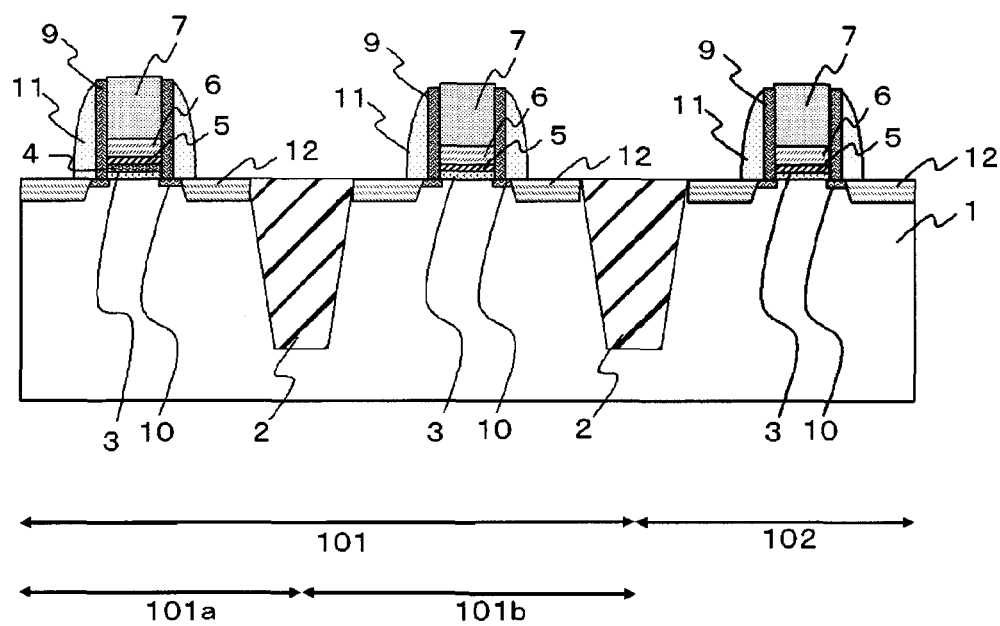
FIG. 8 is a diagram illustrating a method of manufacturing a semiconductor device according to an embodiment of the invention.
Figure 9:
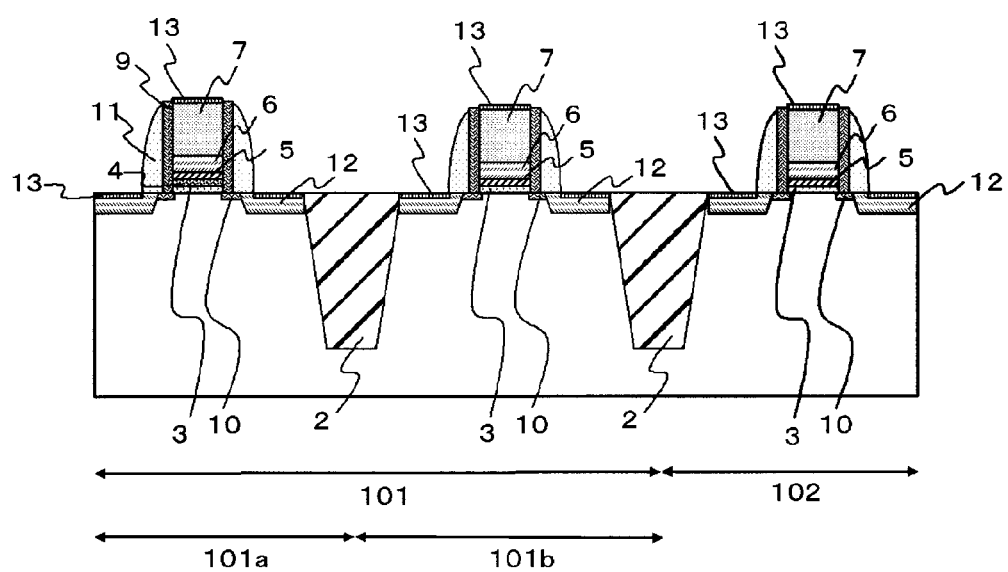
FIG. 9 is a diagram illustrating a method of manufacturing a semiconductor device according to an embodiment of the invention.

Subsequently, after forming an oxide film having a thickness of 3 nm to 20 nm, an offset spacer 9 is formed through dry etching (FIG. 6), and extension impurity implantation and annealing are performed so that an extension region 10 is formed. Furthermore, a side wall spacer film 11 is formed of silicon nitride or the like in the side wall of the gate electrode (FIG. 7), and then, ion implantation is performed by using the gate electrode and the side wall spacer film 11 as a mask so as to form the source/drain region 12 (FIG. 8). Then, a silicide film 13 is formed so that the structure shown in FIG. 9 is obtained.

Figure 10:
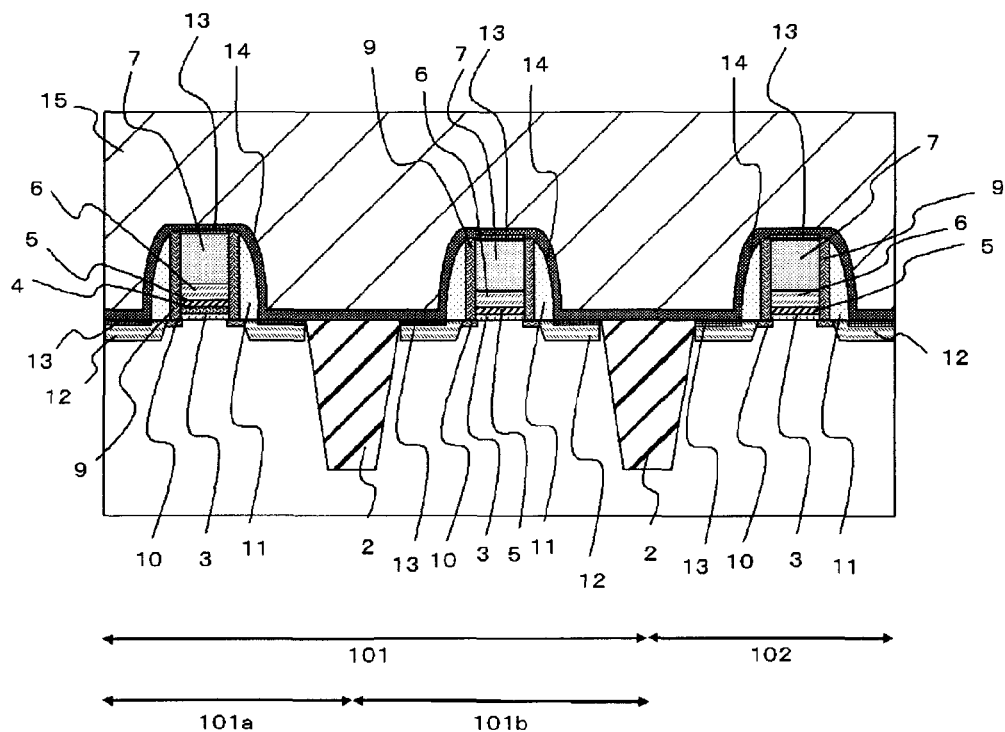
FIG. 10 is a diagram illustrating a method of manufacturing a semiconductor device according to an embodiment of the invention.
Figure 11:
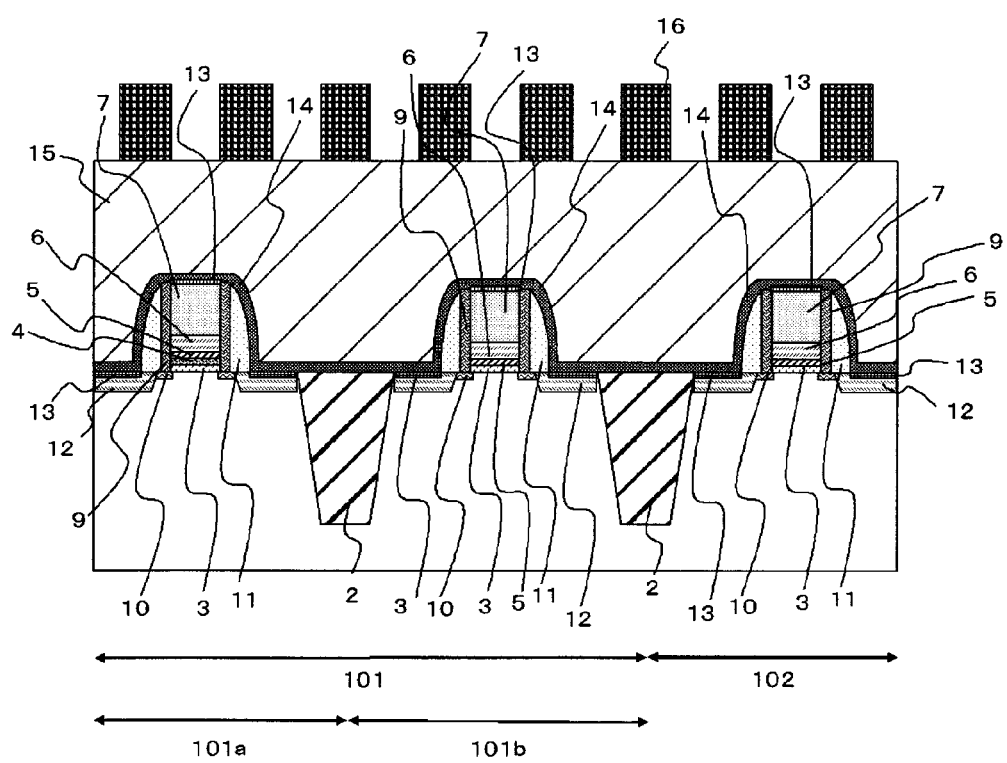
FIG. 11 is a diagram illustrating a method of manufacturing a semiconductor device according to an embodiment of the invention.
Figure 12:
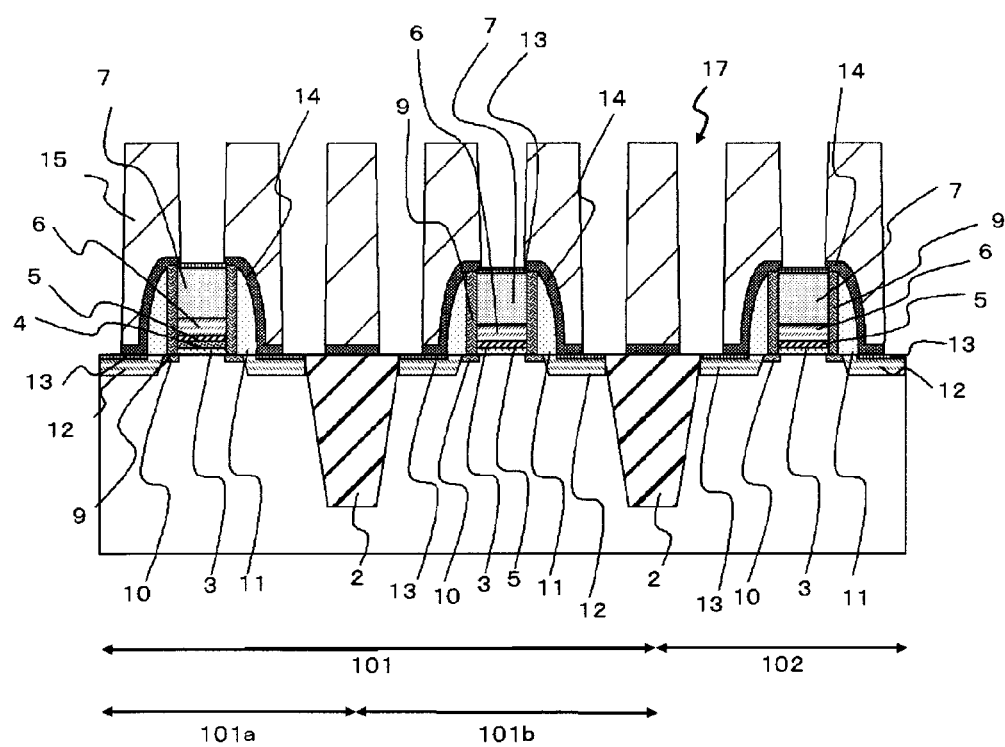
FIG. 12 is a diagram illustrating a method of manufacturing a semiconductor device according to an embodiment of the invention.

Subsequently, in the structure shown in FIG. 9, the exposed surface is covered by the etching stopper film 14. Then, an interlayer insulation film 15 is formed using a low-dielectric film (FIG. 10). A patterning process is performed using the photo resist (FIG. 11), and a contact throughhall 17 is formed through etching (FIG. 12). Then, a conductive plug 18 is filled in the contact throughhall 17 so that the semiconductor device according to the present embodiment is completed as shown in FIG. 1.

Subsequently, the effects of the semiconductor device according to the present embodiment will be described. In the semiconductor device according to the present embodiment, while the cap film 4 is provided in the gate insulating film 5 of the logic region 101, the cap film 4 is not provided in the DRAM region 102. As a result, while a high-speed operation can be made by controlling the threshold voltage of the logic region 101, the threshold voltage can be improved in the DRAM region 102 without implanting excessive ions. In addition, in the DRAM region 102, it is possible to obtain a structure that does not have difficulty in the process. Therefore, while the logic is operated at a high speed, the leakage current of the DRAM is decreased without variability, so that it possible to obtain an embedded DRAM device with an improved hold characteristic and an excellent product yield.

Hereinafter, the effect of the present embodiment will be described in more detail comparing with the related art. As a representative example of the related art, there is an embedded DRAM device including the NMOS transistor having a LaO$_x$ film as the cap film. FIG. 17A is a cross-sectional view illustrating a transistor included in the DRAM of the related art, and FIG. 17B is a cross-sectional view illustrating the gate electrode of the transistor of FIG. 17A. In this example of the related art, as shown in FIG. 17A, a gate electrode is formed by sequentially stacking the silicon oxide film 93, the LaO$_x$ film 94, the HfSiO$_x$ film 95, the TiN conductive layer 96, and the poly-silicon 97 on the silicon substrate 91 having the device isolation film 92.

Figure 13:
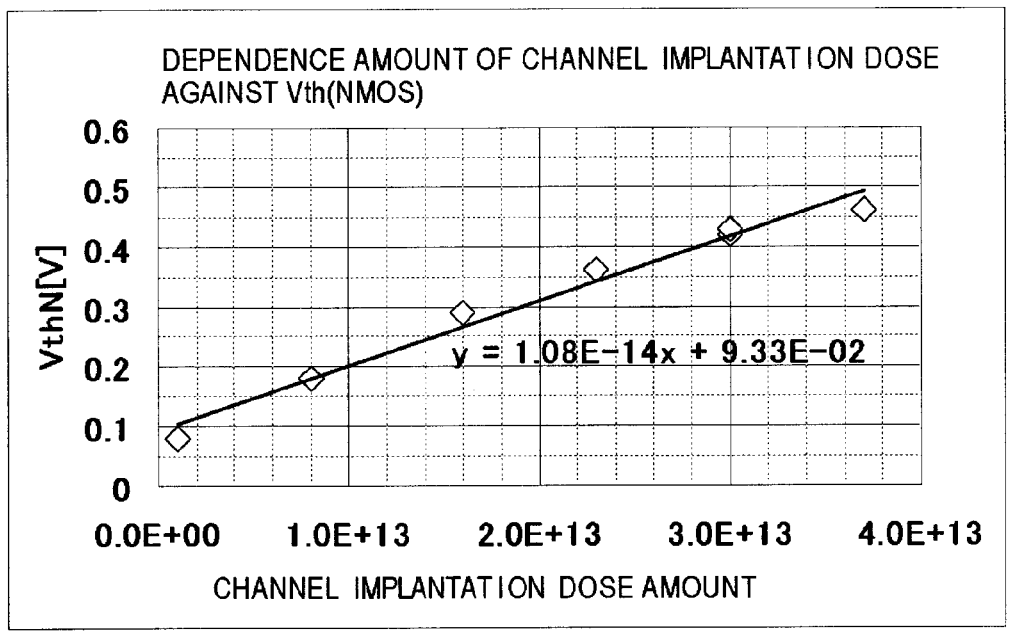
FIG. 13 is a diagram illustrating effects of the semiconductor device according to an embodiment of the invention.
Figure 14:
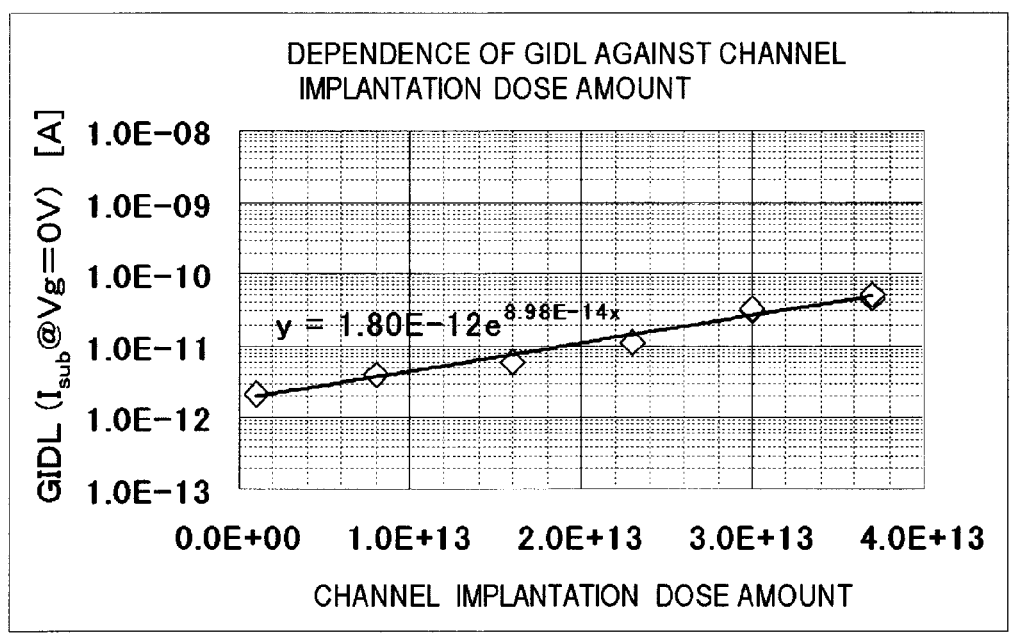
FIG. 14 is a diagram illustrating effects of the semiconductor device according to an embodiment of the invention.

In such an embedded DRAM device obtained by applying the HK/MG process, if the DRAM cell transistor (NMOS) and the logic NMOS have the same structure, it is necessary to increase the channel concentration of the transistor of the DRAM region in order to set the threshold voltages of each region to desired levels. However, as the channel concentration of the DRAM region increases, the threshold voltage increases as shown in FIG. 13 while the gate induced drain leakage (GIDL) current I$_{GIDL}$ increases as the channel concentration increases as shown in FIG. 14. Therefore, the hold characteristic of the DRAM is degraded.

Figure 18:
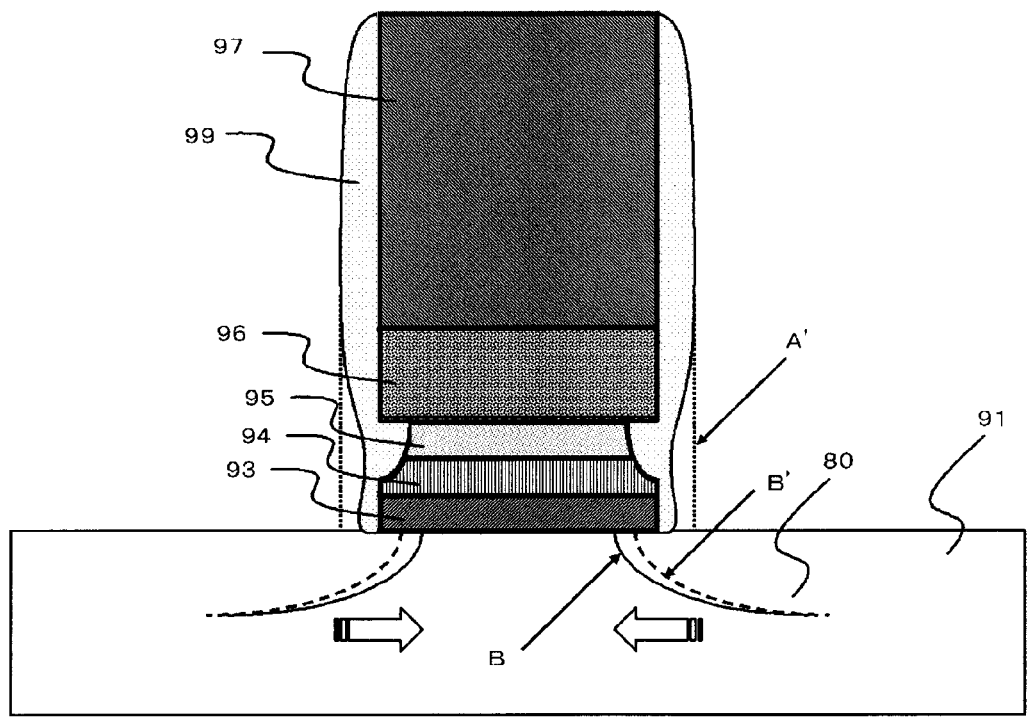
FIG. 18 is a diagram illustrating a semiconductor device of the related art.

In addition, as shown in FIG. 17B, the HfSiO$_x$ film 95 is side-etched through the wet etching for manufacturing the gate electrode so that notching N may occur. It is thought that this is because the high-dielectric constant insulation film obtained by thermally diffusing La has a low resistance to the fluorine system etchant. When the notching N occurs in the transistor of the DRAM region 102, an abnormal leakage is locally generated (particularly, in the GIDL current I$_{GIDL}$). Although not apparent, it is thought that this mechanism is obtained because the thickness of the offset spacer film 99 is relatively thinner than the design A' in the portions of the notching N as shown in FIG. 18, so that the extension region 80 is formed in the vicinity B of the center of the gate electrode rather than the design B', overlapping between the gate electrode and the extension region 80 increases. As the abnormal leakage is locally generated by the notching, for example, a product yield of the semiconductor device having a large-scaled memory array is degraded.

In addition, depending on the direction of the notching N, there was a problem that the transistor characteristic becomes left-right asymmetric.

Figure 19:
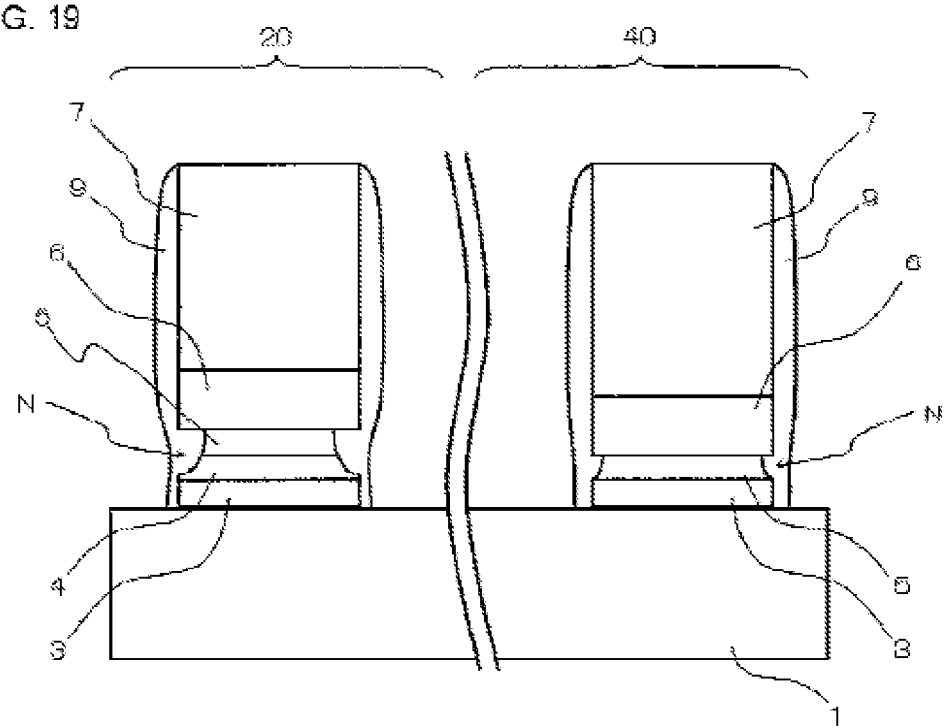
FIG. 19 is a cross-sectional view illustrating the semiconductor device according to an embodiment of the invention in detail.

Meanwhile, according to the present embodiment, only the NMOS transistor 20 of the logic region 101 has the cap film 4, and the cap film 4 is not formed in the NMOS transistor 40 of the DRAM region 102. As a result, since it is possible to decrease the threshold voltage without implanting excessive ions, it is possible to decrease the GIDL current IGIDL. In addition, it is difficult for notching to occur in the gate insulating film 5 of the DRAM region 102 during the manufacturing of the gate electrode shown in FIG. 5. FIG. 19 illustrates the notching that occurs in the gate insulating film 5 at the transistor 40 without the cap film 4 in comparison to the gate insulating film 5 at the transistor 20 with the cap film 4. Therefore, it is possible to form the extension region 10 in a desired position and reduce generation of a local abnormal leakage, particularly, the GIDL current IGIDL. Therefore, it is possible to improve operability of the logic region 101 and obtain an excellent product yield of the embedded DRAM device by improving the hold characteristic of the DRAM region 102. FIG. 19 additionally illustrates that a thickness of the offset spacer 9 at the first transistor 20 having the cap film 4, which has greater notching in the gate insulating film at the first transistor 20, is relatively thinner than a thickness of the offset spacer 9 at the second transistor 40 without the cap film, which has less notching in the gate insulating film 5 at the second transistor 40.

In addition, the impurity can be simultaneously injected to the NMOS region 101a and the DRAM region 102 when the implantation amount, the implantation energy, the valence of ion, and the implantation angle, or the like are the same. In this case, since the number of processes can be reduced, it is possible to improve a throughput. In addition, according to the present embodiment, the gate insulating film 5 is interposed between the cap film 4 and the metal gate electrode 6. As a result, it is possible to form the gate insulating film 5 after removing the cap film 4 from the DRAM region 102. In this configuration, it is not necessary to consider the damage to the gate insulating film 5 caused by etching of the cap film 4. When the gate insulating film 5 is made of a high-dielectric constant insulation film, damage may easily occur in the process. Therefore, it is possible to further improve the device characteristic using the aforementioned configuration.

EXAMPLES

Example

In the example, the configuration shown in FIG. 1 was used. The element isolation layer 2 having an STI structure was formed on the silicon substrate 1, and the logic region 101 and the DRAM region 102 were formed. In addition, the NMOS region 101a and the PMOS region 101b were formed in the logic region 101. The p-type well was formed in the NMOS region 101a and the DRAM region 102 of the silicon substrate 1, and the n-type well was formed in the PMOS region 101b. Boron (B) ions at $1.0 \times 10^{13}$ cm$^{-2}$ were implanted to the NMOS region 101a of the silicon substrate 1 such that the threshold voltage Vth of the transistor 20 became 0.2 V. Arsenic (As) ions at $1.0 \times 10^{12}$ cm$^{-2}$ were implanted to the PMOS region 101b of the silicon substrate 1 such that the threshold voltage Vth of the transistor 30 became 0.2 V. Boron (B) ions at $1.0 \times 10^{12}$ cm$^{-2}$ were implanted to the NMOS region 102 of the silicon substrate 1 simultaneously with the region 101a such that the threshold voltage Vth of the transistor 40 became 0.5 V. In the NMOS transistor 20, a gate electrode was formed by sequentially stacking the silicon oxide film 3, the cap film 4 made of $La_2O_3$, the gate insulating film 5 made of $HfSiO_x$, the metal gate electrode 6 made of TiN, and the poly-silicon 7 on the silicon substrate 1. The PMOS transistor 30 and the NMOS transistor 40 were similar to the NMOS transistor 20 except that the cap film 4 was not provided. In addition, the NMOS transistor 40 that does not have the cap film 4 had a threshold voltage Vth of 0.5 V with the same boron plantation amount as that of the region 101a.

Reference Example 1

In the structure of the example, $LaO_x$ was formed in the NMOS transistor of the DRAM region 102. Lanthanum (La) was prepared by changing the thickness of 0.1 nm to 0.4 nm.

Reference Example 2

In the structure of the example, $LaO_x$ was formed in the NMOS transistor of the DRAM region 102. However, boron (B) ions at $3.8 \times 10^{13}$ cm$^{-3}$ were implanted to the NMOS region 102 of the silicon substrate 1 such that the threshold voltage Vth of the transistor 40 became 0.5 V.

Evaluation 1

Figure 15:
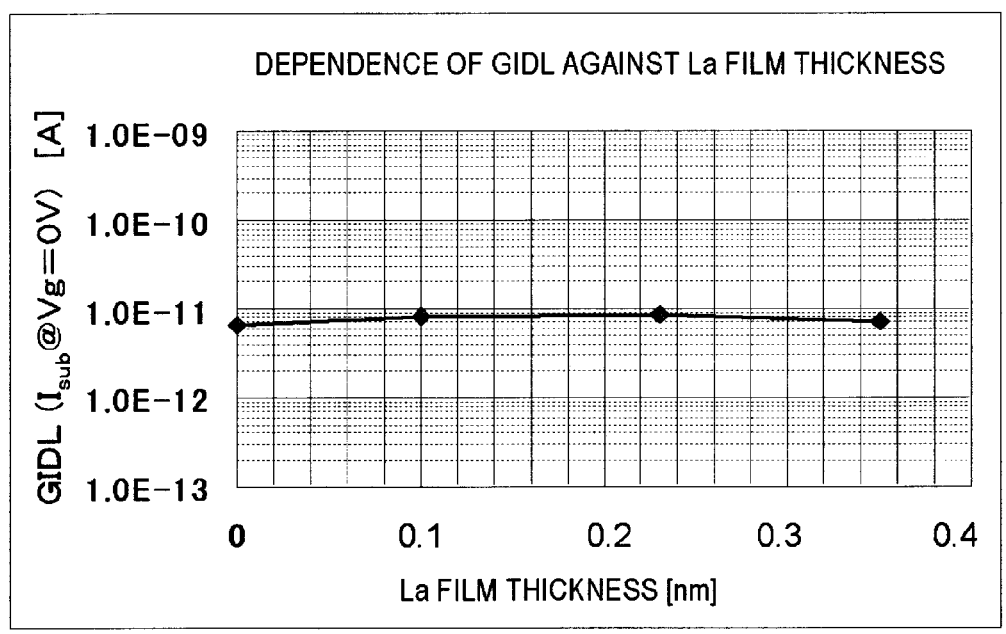
FIG. 15 is a diagram illustrating a result of an example.

In the example and the reference example 1, FIG. 15 illustrates the result of investigating the dependence of the film thickness of La on the GIDL current. Change of the GIDL current dependent on the film thickness of La was not observed.

Evaluation 2

Figure 16:
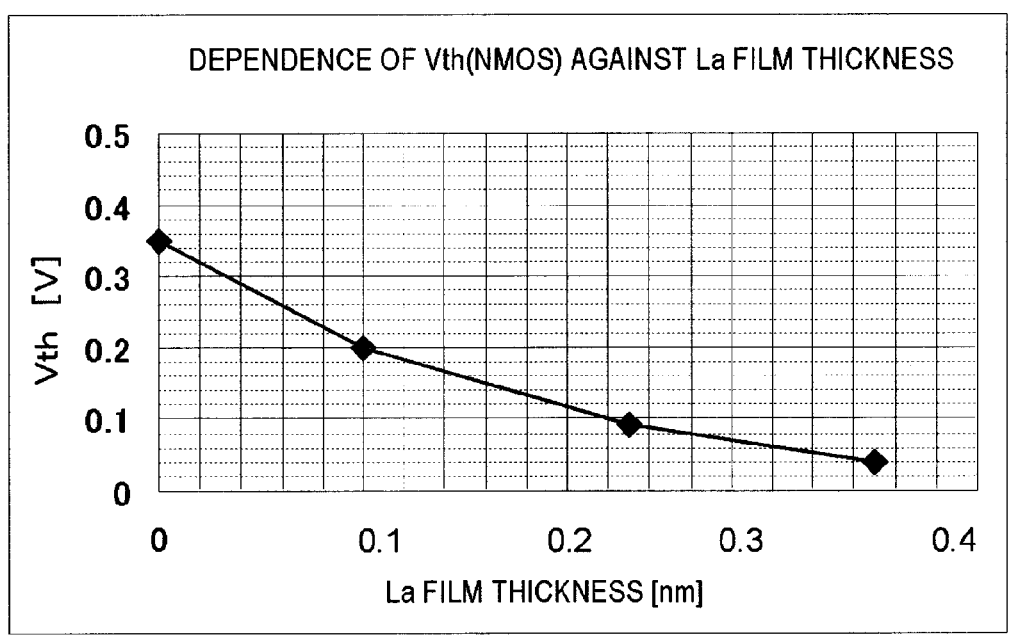
FIG. 16 is a diagram illustrating a result of an example.

In the example and the reference example 1, FIG. 16 illustrates the result of investigating the dependence of the film thickness of La on the threshold voltage Vth. By setting the film thickness of La to be equal to or smaller than 0.3 nm, the threshold voltage Vth increased as the film thickness was decreased.

Evaluation 3

In the example and the reference example 2, the GIDL current was compared. As a result, the GIDL current in the transistor of the example was decreased by ⅒ or less compared with the transistor of the reference example 2 having the same threshold voltage Vth.

Hereinbefore, while the embodiment of the invention has been described with reference to the accompanying drawings, these are just examples of the invention, and various other configurations may be employed. For example, while it has been exemplarily described in the embodiment that the transistor of the DRAM region and the transistor of the logic region having the cap film have an N-type, the transistor of the DRAM region and the transistor of the logic region having the cap film may have the same conductive type. In addition, while it has been exemplarily described in the embodiment that the DRAM cell is provided in the RAM region in the embodiment, the SRAM cell may be provided in the RAM region. As a result, since it is possible to reduce a random variability in the transistor characteristic and simultaneously prevent an abnormal leakage current, it is possible to improve a product yield of the embedded SRAM device. In addition, it has been exemplarily described in the embodiment that the cap film is provided between the substrate and the stack structure of the metal gate electrode and the gate insulating film in the embodiment. However, the cap film may be provided between the metal gate electrode and the gate insulating film. In other words, the cap film may be underlain, and the gate insulating film may be overlain. In addition, the gate insulating film may be underlain, and the cap film may be overlain.

It is apparent that the present invention is not limited to the above embodiment, and may be modified and changed without departing from the scope and spirit of the invention.

What is claimed is:

1. A semiconductor device comprising:
a substrate having a logic region and a random access memory (RAM) region;
a first transistor formed in the logic region; and
a second transistor formed in the RAM region,
wherein said first and second transistors have a stack structure obtained by sequentially stacking a gate insulating film and a metal gate electrode over the substrate,
said first transistor has a cap film containing an element selected from a group consisting of lanthanum, ytterbium, magnesium, strontium and erbium as a composition element between said substrate and said metal gate electrode,
the first and second transistors have the same conductive type,
among the first and second transistors, said cap film is only formed in said first transistor of the logic region and is not formed in said second transistor of the RAM region having the same conductive type as the first transistor, and
the gate insulating film at the second transistor has less notching in the gate insulating film in a channel length direction of the second transistor than notching in the gate insulating film at the first transistor in a channel length direction of the first transistor.

2. The semiconductor device according to claim 1, wherein said first and second transistors are n-channel type field effect transistors.

3. The semiconductor device according to claim 1, wherein said cap film has contact with said gate insulating film.

4. The semiconductor device according to claim 3, wherein said cap film is interposed between said gate insulating film and said substrate.

5. The semiconductor device according to claim 1, wherein said logic region has a third transistor having a stack structure of a gate insulating film and a metal gate electrode, and said first transistor and said third transistor constitute a CMOS circuit.

6. The semiconductor device according to claim 5, wherein said cap film is not formed in the third transistor.

7. The semiconductor device according to claim 1, wherein the gate insulating film comprises a high-dielectric constant insulation film containing hafnium as an essential element.

8. The semiconductor device according to claim 7, wherein said cap film contains lanthanum as an essential element, and said lanthanum of said first transistor is diffused to said high-dielectric constant insulation film.

9. The semiconductor device according to claim 1, wherein said metal gate electrode contains an element selected from a group consisting of titanium, tantalum and molybdenum as a composition element.

10. A method of manufacturing a semiconductor device, the method comprising:
forming a gate insulating film over a substrate having a logic region and a random access memory (RAM) region;
forming a metal gate electrode over said gate insulating film;
forming a cap film interposed between said substrate and said metal gate electrode;
removing said cap film formed in said RAM region and in a portion of the logic region of a different type from the RAM region from which the cap film is removed; and
patterning a layer structure including the gate insulating film, the gate electrode, and the cap film,
wherein said cap film contains an element selected from a group consisting of lanthanum, ytterbium, magnesium, strontium, and erbium as a composition element, and
wherein a notching in a channel length direction of the gate insulating film formed in the RAM region is less than a notching in the channel length direction of the gate insulating film formed in a portion of the logic region.

11. The semiconductor device according to claim 6, wherein the third transistor is a p-channel type field effect transistor.

12. The semiconductor device according to claim 8,
wherein each of the first and second transistors has an offset spacer formed on a side surface of the stack structure, and
a thickness of the offset spacer located on a side surface of the gate insulating film of the second transistor is thicker than a thickness of the offset spacer located on a side surface of the gate insulating film of the first transistor.

13. The semiconductor device according to claim 1,
wherein each of the first and second transistors has an offset spacer formed on a side surface of the stack structure, and
a thickness of the offset spacer located on a side surface of the gate insulating film of the second transistor is thicker than a thickness of the offset spacer located on a side surface of the gate insulating film of the first transistor.

* * * * *